United States Patent
Lee et al.

(12) United States Patent (10) Patent No.: US 6,403,281 B1
(45) Date of Patent: Jun. 11, 2002

(54) CROSS-LINKER MONOMER COMPRISING DOUBLE BOND AND PHOTORESIST COPOLYMER CONTAINING THE SAME

(75) Inventors: Geun Su Lee; Jae Chang Jung; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/643,460

(22) Filed: Aug. 22, 2000

(30) Foreign Application Priority Data

Aug. 23, 1999 (KR) .............................. 99-35046

(51) Int. Cl.⁷ .......................... G03F 7/004; C08F 10/00
(52) U.S. Cl. .................. 430/270.1; 430/326; 525/376; 525/387; 525/910; 526/219.6; 526/227; 526/281; 526/282; 526/272; 526/324
(58) Field of Search .............................. 430/270.1, 326; 526/281, 219.6, 227, 282, 272, 324; 525/376, 387, 910, 915

(56) References Cited

U.S. PATENT DOCUMENTS

| | | | | |
|---|---|---|---|---|
| 4,942,204 A | * | 7/1990 | Kennedy ..................... | 525/293 |
| 5,973,085 A | * | 10/1999 | Muhlebach et al. ........ | 526/171 |
| 6,180,316 B1 | * | 1/2001 | Kajita et al. ............. | 430/270.1 |
| 6,200,731 B1 | * | 3/2001 | Lee et al. ................. | 430/270.1 |

FOREIGN PATENT DOCUMENTS

| | | | |
|---|---|---|---|
| EP | 0901043 | * | 3/1999 |
| GB | 2 345 286 A | | 7/2000 |

* cited by examiner

Primary Examiner—Rosemary Ashton
(74) Attorney, Agent, or Firm—Townsend and Townsend and Crew LLP (57) ABSTRACT

The present invention provides a cross-linker monomer of formula 1, a photoresist polymer derived from a monomer comprising the same, and a photoresist composition comprising the photoresist polymer. The cross-linking unit of the photoresist polymer can be hydrolyzed (or degraded or broken) by an acid generated from a photoacid generator on the exposed region. It is believed that this acid degradation of the cross-linking unit increases the contrast ratio between the exposed region and the unexposed region. The photoresist composition of the present invention has improved pattern profile, enhanced adhesiveness, excellent resolution, sensitivity, durability and reproducibility.

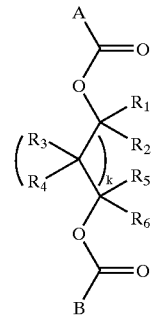

1 where A, B, $R_1$, $R_2$, $R_3$, $R_4$, $R_5$, $R_6$ and k are as defined herein.

21 Claims, 6 Drawing Sheets

CROSS-LINKER MONOMER COMPRISING DOUBLE BOND AND PHOTORESIST COPOLYMER CONTAINING THE SAME

BACKGROUND OF THE INVENTION

1. Field of the Invention

The present invention relates to photoresist cross-linker monomers comprising double bonds, photoresist polymers derived from the same and photoresist compositions comprising such polymer. In particular, the present invention relates to acid labile photoresist cross-linker monomers, polymers derived from the same, and photoresist compositions comprising such polymer. The photoresist compositions of the present invention are suitable for photolithography processes employing KrF, ArF, EUV, VUV and similar light sources.

2. Description of the Background Art

Recently, chemical amplification-type DUV photoresists have been investigated to increase sensitivity in minute image formation processes for preparing semiconductor devices. Such photoresists are prepared by blending a photoacid generator and a matrix resin polymer (i.e., photoresist polymer) comprising an acid labile group.

In a photolithography process, an exposure of photoresist to light of a particular wavelength generates an acid from the photoacid generator that is present in the photoresist. This generated acid causes the main chain or the branched chain of the resin to decompose or become cross-linked. In addition, the acid removes the acid labile group which is present in the polymer and changes the polarity of the photoresist in the exposed region. This polarity change creates a solubility difference in a developing solution between the exposed portion and the unexposed portion, thereby allowing a pattern formation. The resolution of the pattern that is formed depends on the wavelength of the light—i.e., in general, a shorter wavelength allows formation of more minute patterns.

In general, a useful photoresist (hereinafter, abbreviated as "PR") has a variety of desired characteristics, such as excellent etching resistance, heat resistance and adhesiveness. In addition, a photoresist should be easily developable in a commercially readily available developing solution, such as 2.38 wt % or 2.6 wt % aqueous tetramethylammonium hydroxide (TMAH) solution. However, it is very difficult to synthesize a photoresist polymer that satisfies all of these characteristics.

A resin (i.e., photoresist polymer) like novolac resin having high transparency and high etching resistance at 193 nm of wavelength has been investigated. In addition, researchers at the Bell Research Center have investigated improving the etching resistance by increasing the amount of alicyclic units in the polymer backbone of the resin. Furthermore, Fujitsu and Sipri have studied the effect of adding methacrylate and/or acrylate monomers to improve the etching resistance. Unfortunately, the resulting polymers do not have satisfactory etching resistance. Moreover, the cost of producing polymers having increased alicyclic units in the polymer backbone is significantly higher. Furthermore, many photoresist polymers generally have low adhesiveness; therefore, the dense L/S pattern below 150 nm may not form properly.

Therefore, there is a need for a photoresist monomer which provides a polymer having the above described characteristics.

SUMMARY OF THE INVENTION

The present inventors have found that the contrast ratio between the exposed region and the unexposed region of a photoresist film can be enhanced by adding a cross-linker monomer having, preferably, two double bonds to the PR polymer. Moreover, it has been found that the addition of cross-linker monomer as a comonomer also improves a pattern profile.

Accordingly, an object of the present invention is to provide a photoresist cross-linker monomer which comprises a double bond, preferably two double bonds. In particular, a cross-linker monomer which comprises an acid labile group.

Another objective of the present invention is to provide a photoresist polymer derived from such photoresist cross-linker monomer. Preferably, the polymer has an excellent etching resistance, reproducibility, durability, adhesiveness and resolution.

Still another objective of the present is to provide a photoresist composition comprising such photoresist polymer.

DETAILED DESCRIPTION OF THE PREFERRED EMBODIMENTS

The present invention provides a novel photoresist cross-linker monomer, which achieves the above stated objectives, and a process for producing the same. The present invention also provides a photoresist polymer derived from the above described photoresist cross-linker monomer, and a photoresist composition comprising such photoresist polymer. The present invention also provides a semiconductor device fabricated by using such photoresist composition.

In one aspect of the present invention provides a photoresist cross-linker monomer of the formula:

where
A is a moiety of the formula

B is a moiety of the formula each of $R_1$, $R_2$, $R_3$, $R_4$, $R_5$, $R_6$, $R_7$ and $R_8$ is independently H, or substituted or unsubstituted linear or branched $(C_1-C_5)$alkyl; and k is an integer from 0 to 3.

Preferably, each of $R_7$ and $R_8$ is independently H or $CH_3$.

In one aspect of the present invention, the compound of formula 1 is, preferably a compound of formula 2 or 3.

2

3 where $R_1$, $R_2$, $R_3$, $R_4$, $R_5$, $R_6$, $R_7$, $R_8$ and k are those defined above.

As shown in formulas 2 and 3, the cross-linker monomer of the present invention preferably has two double bonds. As shown below, when a mixture of the cross-linker monomer and other photoresist comonomer(s) is polymerized, the cross-linker monomer of the present invention allow formation of a cross-linked polymer. Moreover, the cross-linker unit of the cross-linker monomer can be chemically degraded (i.e., broken) by the acid that is generated at the exposed region. This acid degradation of the cross-linker unit enhances the contrast ratio between the exposed region and the unexposed region of the PR polymer.

Preferably, the cross-linker monomer of formula 2 is selected from the group consisting:

2,5-hexanediol diacrylate; 2,5-hexanediol dimethacrylate; 2,4-pentanediol diacrylate; 2,4-pentanediol dimethacrylate; neopentyl glycol diacrylate; neopentyl glycol dimethacrylate (compound 4, 5, 6, 7, 8, and 9, respectively);

4

5

6

7

8

9

Preferred photoresist polymers (i.e., copolymers) containing the cross-linker monomer of the present invention include polymers of the formula:

10

-continued where $R_1$, $R_2$, $R_3$, $R_4$, $R_5$, $R_6$, $R_7$, $R_8$ and k are those defined above. Each of $R_9$ and $R_{10}$ is independently H, or substituted or unsubstituted linear or branched ($C_1$–$C_5$)alkyl; i is 0 or 1; m and n is independently an integer from 0 to 2; and the ratio of a:b:c:d:e=0–80 mol %: 1–30 mol %: 1–30 mol %: 0.1–48 mol %: 10–50 mol %.

It should be appreciated that the order of each monomeric units represented in a polymer formula of the present invention does not necessarily indicate the actual order of such monomeric units in the actual polymer. The monomeric units represented in the polymer formula is simply intended to indicate the presence of such monomeric unit in the polymer, i.e., when the variable a, b, c, d, or e is not 0. Moreover, the variables a, b, c, d, and e represents a total relative ratio of each units. For example, the total amount "e" of polymeric units derived from maleic anhydride may be inter dispersed throughout the polymer (not necessarily in same concentrations) or all or majority of such polymeric unit may be concentrated in one particular location of the polymer.

As shown above, the cross-linker monomer of formula 1 can be polymerized with other photoresist comonomers using the originally present two double bonds. The resulting polymer is a cross-linked polymer due to the presence of the polymeric unit derived from the cross-linker monomer. Moreover, the cross-linker monomers of the present invention comprises ester moieties which can be degraded (i.e., hydrolyzed) by an acid that is generated from a photoacid generator at the exposed region. Without being bound by any theory, it is believed that this acid degradation of the polymeric unit derived from the cross-linker monomer of the present invention improves the contrast ratio between the exposed region and the unexposed region. Furthermore, unlike other photoresist monomers, e.g., 5-norbornene-2-tert-butylcarboxylate, photoresist cross-linker monomers of the present invention do not generate gas, e.g., isobutene.

As shown in formulas 10 and 11, polymers of the present invention can comprise a polymeric unit derived from a monomer comprising a sterically bulky group. Accordingly, a predetermined amount of norbornylene and tetracyclododecene having a relatively small steric hindrance is added to make it possible to properly control the molecular weight of the polymer to about 5000 to about 8000, to increase the polymerization yield to about 40% or more and to improve the thermal stability of the polymer.

And, the etching speed of the photoresist is reduced relative to the conventional ultraviolet photoresist when the norbornylene and/or the tetracyclododecene moieties are present in the polymer. For example, if the etching speed of the ultraviolet photoresist using $Cl_2$ gas is "1", the etching speed of polymers of the present invention comprising the norbornylene and/or the tetracyclododecene moieties ranges from about 0.8 to about 0.92.

The photoresist polymer of the present invention can be prepared by a variety of methods. In one particularly preferred method, polymers of the present invention are prepared by adding the cross-linker monomer of formula 1 to a mixture of other suitable photoresist monomer(s).

In one particular aspect of the present invention, the process for producing a photoresist polymer of the present invention comprises the steps of:

(a) admixing a cross-linker monomer of formula 1, at least one other suitable photoresist monomer, and a polymerization initiator; and (b) providing conditions sufficient to produce the photoresist polymer.

Preferably, the admixture is dissolved in an organic solvent prior to the polymerization. While a variety of organic solvents can be used in polymerization, the organic solvent is preferably selected from the group consisting of cyclohexanone, tetrahydrofuran, dimethylformamide, dimethylsulfoxide, dioxane, methylethylketone, benzene, toluene and xylene, and mixture thereof.

While a variety of reaction conditions afford the polymer from the admixture, in one particular embodiment the polymerization conditions include heating the admixture to temperature in the range of from about 60 to about 70° C. for 4 to 24 hours under an inert atmosphere, preferably under a nitrogen or an argon atmosphere.

Advantageously, the polymerization initiator is selected from the group consisting of 2,2'-azobisisobutyronitrile (AIBN), acetylperoxide, laurylperoxide, tert-butyl peracetate, tert-butyl hydroperoxide and di-tert-butylperoxide.

In addition, the process can further comprise crystallizing and/or purifying the resulting polymer. In one particular embodiment, purification by crystallization can be achieved using a solvent selected from the group consisting of diethyl ether; petroleum ether; alcohol including methanol, ethanol and isopropanol; water; and mixtures thereof.

The present invention also provides a photoresist composition comprising a photoresist polymer of the present invention, an organic solvent and a photoacid generator.

Sulfide or onium-type compounds are preferably used as the photoacid generator. Alternatively, suitable photoacid generators are selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsalfonium triflate. Preferably, the amount of photoacid generator is in the range of from 0.05 to 10% by weight of the polymer employed. It has been found that when the photoacid generator is used in the amount less than about 0.05%, it lowers the photosensitivity of PR composition, and when the photoacid generator is used in the amount greater than about 10%, it results in a poor pattern formation presumably due to its high light absorption.

The organic solvent for photoresist composition is preferably selected from the group consisting of methyl 3-methoxypropionate, ethyl 3-ethoxypropionate, propylene glycol methyl ether acetate and cyclohexanone, cyclopentanone, 2-heptanone and (2-methoxy)ethyl acetate. The amount of solvent used is preferably in the range of from about 200% to about 1000% by weight of the PR resin (i.e., PR polymer). This ratio has been found to be particularly useful in obtaining a photoresist layer of desirable thickness when coated on to a suitable substrate such as a silicon wafer in production of a semiconductor element. In particular, it has been found by the present inventors that when the amount of organic solvent is about 500% by weight of the PR polymer, a PR layer having 0.5 μm of thickness can be obtained.

In one aspect of the present invention, the photoresist composition is prepared by dissolving the polymer in an amount of 10 to 30% by weight of the organic solvent employed, blending the photoacid generator in an amount of 0.05 to 10% by weight of the polymer employed, and filtering the resulting mixture with a hyperfine filter.

The present invention also provides a process for forming a photoresist pattern comprising the steps of:

(a) coating a photoresist composition described above on a substrate of a semiconductor element to form a photoresist film;

(b) exposing the photoresist film to light using a light source; and (c) developing the exposed photoresist film.

The process for forming the photoresist pattern can further include a baking step before and/or after the exposure step (b). Preferably, the baking step is performed at temperature in the range of from about 70 to about 200° C.

Exemplary light sources which are useful for forming the PR pattern include ArF, KrF, EUV, VUV, E-beam, X-ray and ion beam. Preferably, the irradiation energy is in the range of from about 1 mJ/cm² to about 100 mJ/cm².

The developing step (c) can be carried out using an alkali developing solution or distilled water. The alkali developing solution is preferably an aqueous solution comprising from about 0.01 to about 5 wt % of TMAH.

Furthermore, the present invention provides a semiconductor device, which is manufactured using the photoresist composition described above.

Additional objects, advantages, and novel features of this invention will become apparent to those skilled in the art upon examination of the following examples thereof, which are not intended to be limiting.

I. PREPARATION OF POLYMER

EXAMPLE 1

Synthesis of Poly(mono-2-ethyl-2-(hydroxymethyl) butyl Bicyclo[2.2.1]hept-5-ene-2,3-dicarboxylate/ maleic Anhydride/norbornene/tert-butyl Bicyclo-[2.2.1]hept-5-ene-2-carboxylate/2,5-hexanediol Diacrylate)

To 25ml of tetrahydrofuran was added mono-2-ethyl-2-(hydroxymethyl)butyl bicyclo[2.2.1]hept-5-ene-2,3-dicarboxylate (10 mmol), maleic anhydride (100 mmol), norbornene (33 mmol), tert-butyl bicyclo-[2.2.1]hept-5-ene-2-carboxylate (55 mmol), 2,5-hexanediol diacrylate (2 mmol) and AIBN (0.30 g), and the resulting mixture was heated to temperature of about 65° C. for 8 hours. The polymer thus prepared was precipitated in diethyl ether or diethyl ether/petroleum ether mixture to produce a crude solid. The solid was filtered and dried to obtain the title polymer.

EXAMPLE 2

Synthesis of Poly(mono-2-ethyl-2-(hydroxymethyl) butyl Bicyclo[2.2.1]hept-5-ene-2,3-dicarboxylate/ maleic Anhydride/norbornene/tert-butyl Bicyclo-[2.2.1]hept-5-ene-2-carboxylate/2,4-pentanediol Diacrylate)

The title polymer was obtained by repeating the procedure of Example 1 using 2,4-pentanediol diacrylate (2 mmol) instead of 2,5-hexanediol diacrylate (2 mmol).

EXAMPLE 3

Synthesis of Poly(mono-2-ethyl-2-(hydroxymethyl) butyl Bicyclo[2.2.1]hept-5-ene-2,3-dicarboxylate/ maleic Anhydride/norbornene/tert-butyl Bicyclo-[2.2.1]hept-5-ene-2-carboxylate/neopentyl Glycol Diacrylate)

The title polymer was obtained by repeating the procedure of Example 1 using neopentyl glycol diacrylate (2 mmol) instead of 2,5-hexanediol diacrylate (2 mmol).

EXAMPLE 4

Synthesis of Poly(mono-2-ethyl-2-(hydroxymethyl) butyl Bicyclo[2.2.1]hept-5-ene-2,3-dicarboxylate/ maleic Anhydride/norbornene/tert-butyl Bicyclo-[2.2.1]hept-5-ene-2-carboxylate/2,5-hexanediol Dimetacrylate)

The title polymer was obtained by repeating the procedure of Example 1 using 2,5-hexanediol dimetacrylate (2 mmol) instead of 2,5-hexanediol diacrylate (2 mmol).

EXAMPLE 5

Synthesis of Poly(mono-2-ethyl-2-(hydroxymethyl) butyl Bicyclo[2.2.1]hept-5-ene-2,3-dicarboxylate/ maleic Anhydride/norbornene/tert-butyl Bicyclo-[2.2.1]hept-5-ene-2-carboxylate/2,4-pentanediol Dimetacrylate)

The titled polymer was obtained by repeating the procedure of Example 1 using 2,4-pentanediol dimetacrylate (2 mmol) instead of 2,5-hexanediol diacrylate (2 mmol).

EXAMPLE 6

Synthesis of Poly(mono-2-ethyl-2-(hydroxymethyl) butyl Bicyclo[2.2.1]hept-5-ene-2,3-dicarboxylate/ maleic Anhydride/norbornene/tert-butyl Bicyclo-[2.2.1]hept-5-ene-2-carboxylate/neopentyl Glycol Dimetacrylate)

The title polymer was obtained by repeating the procedure of Example 1 but using neopentyl glycol dimetacrylate(2 mmol), instead of 2,5-hexanediol diacrylate (2 mmol).

II. PREPARATION OF PHOTORESIST COMPOSITION AND FORMATION OF PATTERN

EXAMPLE 7

To 50 g of ethyl 3-ethoxypropionate was added 10 g of the polymer prepared in Example 1, and 0.12 g of triphenylsulfonium triflate as a photoacid generator. The resulting mixture was stirred and filtered through a 0.20 μm filter to prepare a photoresist composition.

The photoresist composition thus prepared was spin-coated on a silicon wafer, and soft-baked in an oven or hot plate of 110° C. for 90 seconds. After baking, the photoresist was exposed to light using an ArF laser exposer, and then post-baked at 120° C. for 90 seconds. When the post-baking was completed, it was developed in 2.38 wt %.

To 45 g of ethyl 3-ethoxypropionate was added 10 g of the polymer prepared in Example 2, and 0.12 g of triphenylsulfonium triflate as a photoacid generator. The mixture was stirred and filtered through a 0.20 μm filter to prepare a photoresist composition.

Figure 1:
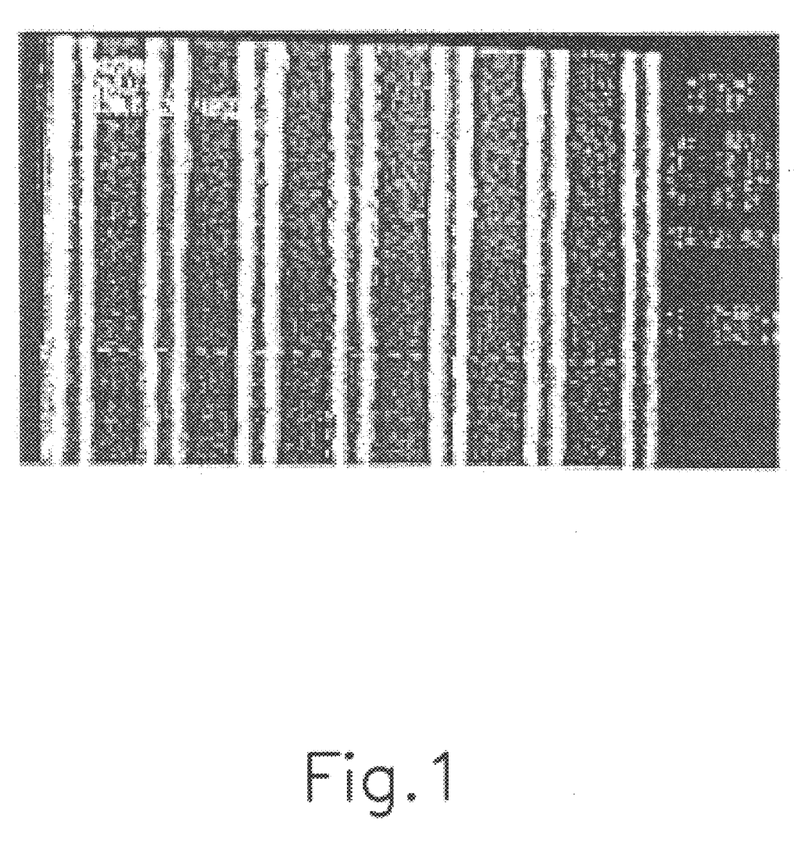
FIG. 1 shows a photoresist pattern obtained in Example 7.
Figure 2:
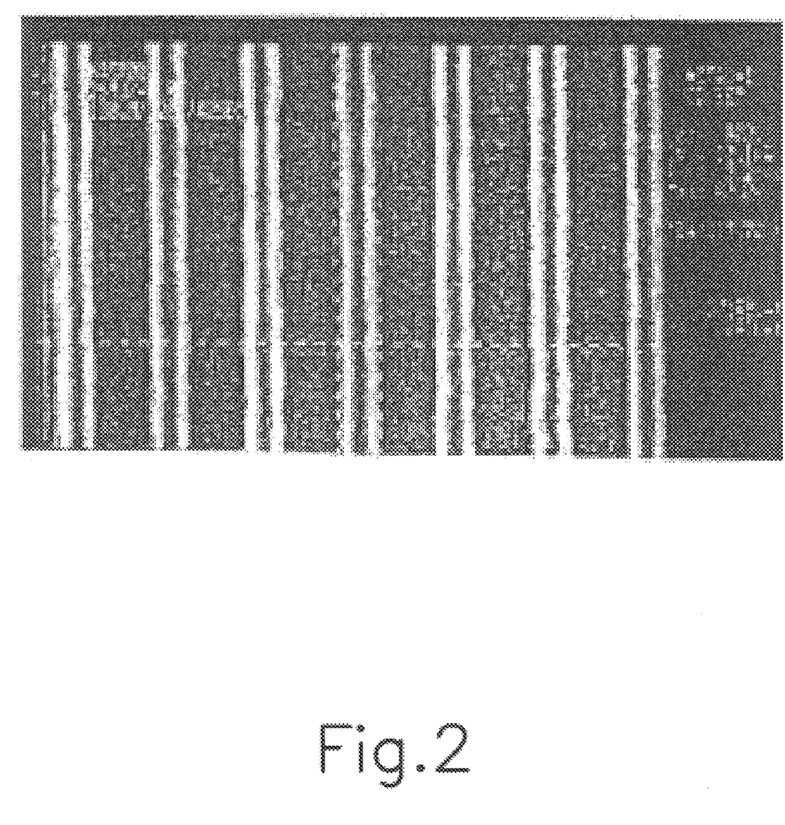
FIG. 2 shows a photoresist pattern obtained in Example 8.

The photoresist composition thus prepared was spin-coated on a silicon wafer, and soft-baked in an oven or hot plate of 110° C. for 90 seconds. After baking, the photoresist was exposed to light using an ArF laser exposer, and then post-baked at 120° C. for 90 seconds. When the post-baking was completed, it was developed in 2.38 wt % aqueous TMAH (tetramethylammonium hydroxide) solution for 40 seconds to obtain a 0.13 μm L/S pattern (See FIG. 2).

EXAMPLE 9

To 50 g of ethyl 3-ethoxypropionate was added 10 g of the polymer prepared in Example 3, and 0.12 g of triphenylsulfonium triflate as a photoacid generator. The mixture was stirred and filtered through a 0.20 μm filter to prepare a photoresist composition.

Figure 3:
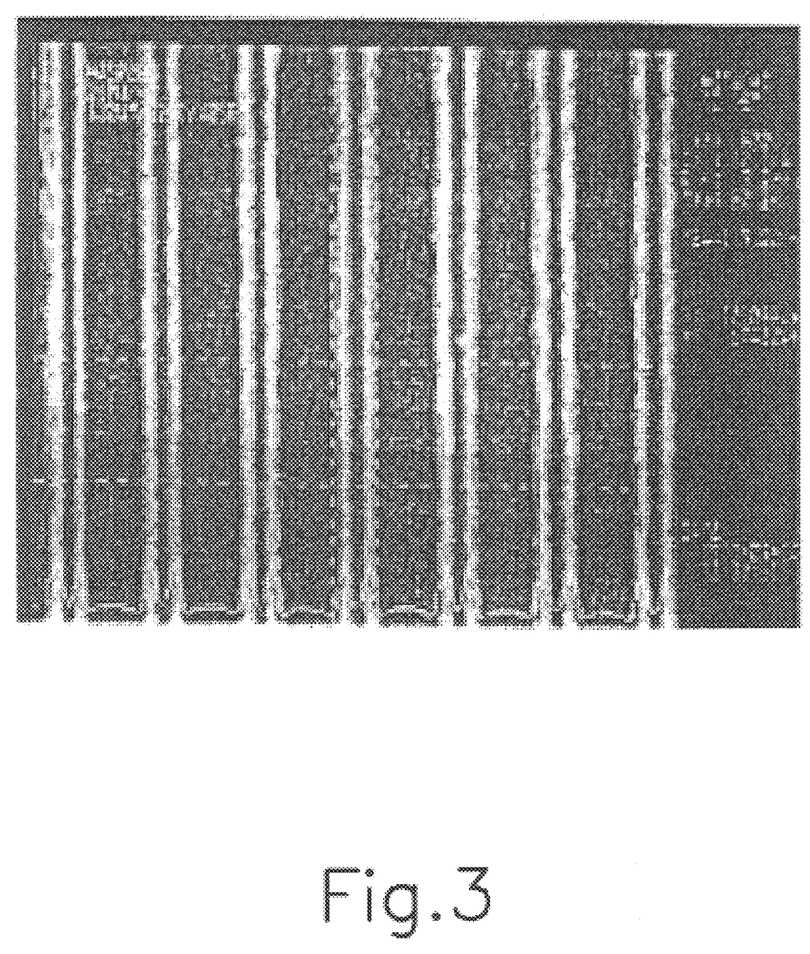
FIG. 3 shows a photoresist pattern obtained in Example 9.

The photoresist composition thus prepared was spin-coated on a silicon wafer, and soft-baked in an oven or hot plate of 110° C. for 90 seconds. After baking, the photoresist was exposed to light using an ArF laser exposer, and then post-baked at 120° C. for 90 seconds. When the post-baking was completed, it was developed in 2.38 wt % aqueous TMAH (tetramethylammonium hydroxide) solution for 40 seconds to obtain a 0.13 μm L/S pattern (See FIG. 3).

EXAMPLE 10

To 50 g of ethyl 3-ethoxypropionate was added 10 g of the polymer prepared in Example 4, and 0.12 g of triphenylsulfonium triflate as a photoacid generator. The mixture was stirred and filtered through a 0.20 μm filter to prepare a photoresist composition.

The photoresist composition thus prepared was spin-coated on a silicon wafer, and soft-baked in an oven or hot plate of 110° C. for 90 seconds. After baking, the photoresist was exposed to light using an ArF laser exposer, and then post-baked at 120° C. for 90 seconds. When the post-baking was completed, it was developed in 2.38 wt %.

Figure 4:
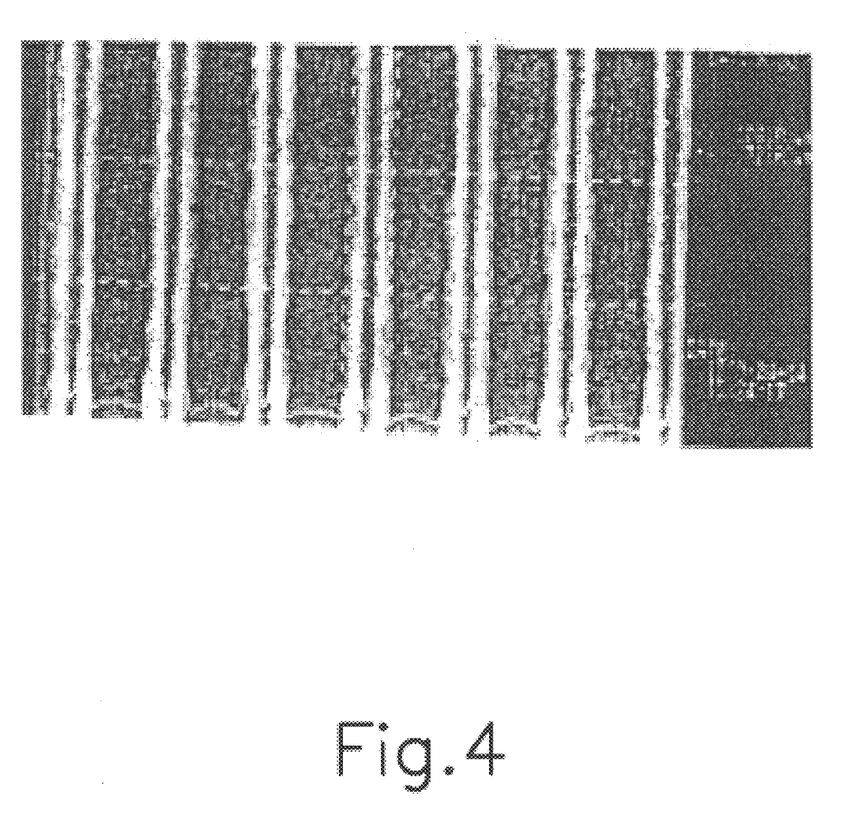
FIG. 4 shows a photoresist pattern obtained in Example 10.

The photoresist composition thus prepared was spin-coated on a silicon wafer, and soft-baked in an oven or hot plate of 110° C. for 90 seconds. After baking, the photoresist was exposed to light using an ArF laser exposer, and then post-baked at 120° C. for 90 seconds. When the post-baking was completed, it was developed in 2.38 wt % aqueous TMAH (tetramethylammonium hydroxide) solution for 40 seconds to obtain a 0.13 μm L/S pattern (See FIG. 4).

EXAMPLE 11

To 45 g of ethyl 3-ethoxypropionate was added 10 g of the polymer prepared in Example 5, and 0.12 g of triphenylsulfonium triflate as a photoacid generator. The mixture was stirred and filtered through a 0.20 μm filter to prepare a photoresist composition.

Figure 5:
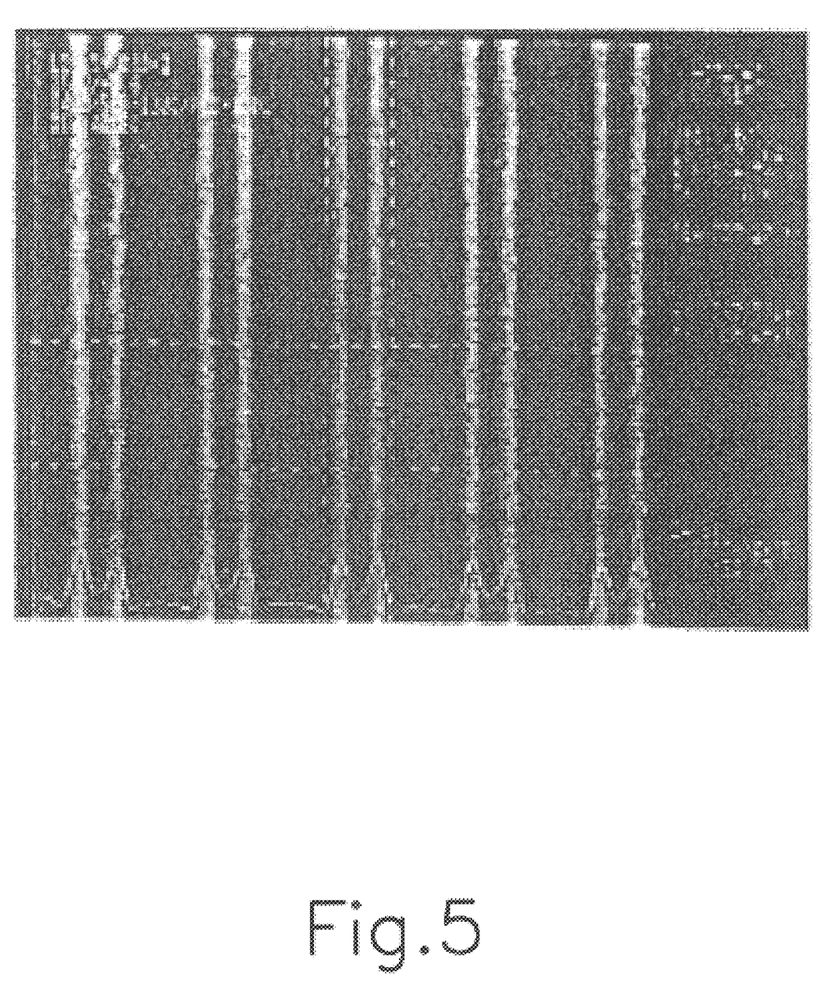
FIG. 5 shows a photoresist pattern obtained in Example 11.

The photoresist composition thus prepared was spin-coated on a silicon wafer, and soft-baked in an oven or hot plate of 110° C. for 90 seconds. After baking, the photoresist was exposed to light using an ArF laser exposer, and then post-baked at 120° C. for 90 seconds. When the post-baking was completed, it was developed in 2.38 wt % aqueous TMAH (tetramethylammonium hydroxide) solution for 40 seconds to obtain a 0.13 μm L/S pattern (See FIG. 5).

EXAMPLE 12

To 50 g of ethyl 3-ethoxypropionate was added 10 g of the polymer prepared in Example 6, and 0.12 g of triphenylsulfonium triflate as a photoacid generator. The mixture was stirred and filtered through a 0.20 μm filter to prepare a photoresist composition.

Figure 6:
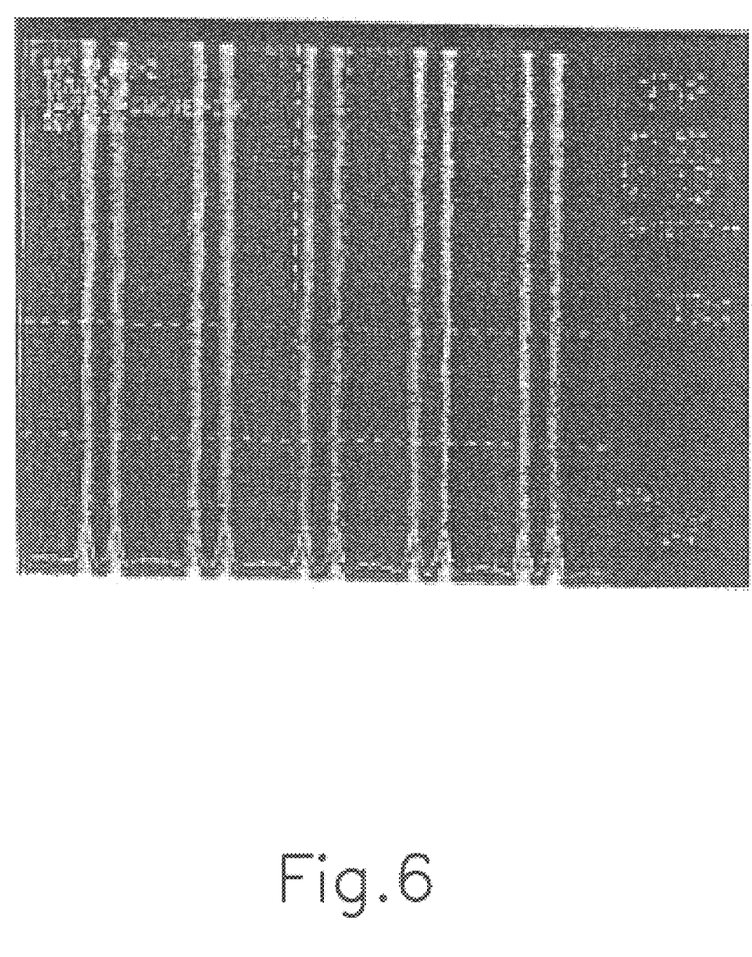
FIG. 6 shows a photoresist pattern obtained in Example 12.

The photoresist composition thus prepared was spin-coated on a silicon wafer, and soft-baked in an oven or hot plate of 110° C. for 90 seconds. After baking, the photoresist was exposed to light using an ArF laser exposer, and then post-baked at 120° C. for 90 seconds. When the post-baking was completed, it was developed in 2.38 wt % aqueous TMAH (tetramethylammonium hydroxide) solution for 40 seconds to obtain a 0.13 μm L/S pattern (See FIG. 6).

As discussed above, photoresist polymers of the present invention comprise a polymeric unit derived from a cross-linker monomer. The cross-linker monomer comprises functional moiety which can be degraded (e.g., broken or hydrolyzed) by an acid. As a result, the cross-linker unit in polymers of the present invention can be hydrolyzed by the acid that is generated in the exposed region. It is believed that this acid degradation of the cross-linker is responsible for the increased contrast ratio between the exposed region and the unexposed region. Moreover, polymers of the present invention do not generate gases such as isobutene, thereby restricting gas generation.

It has been found by the present inventors that photoresist compositions of the present invention have improved pattern profile and enhanced adhesiveness, in addition to excellent resolution, sensitivity, durability and reproducibility.

What is claimed is:

1. A photoresist polymer derived from monomers comprising:

(i) a cross-linker monomer of the formula:

wherein

A is a moiety of the formula

B is a moiety of the formula each of $R_1$, $R_2$, $R_3$, $R_4$, $R_5$, $R_6$, $R_7$ and $R_8$ is independently H, or substituted or unsubstituted linear or branched ($C_1$–$C_5$)alkyl; and k is an integer from 0 to 3;

(ii)

where i is 0 or 1; and

(iii) at least one other suitable photoresist monomer.

2. The photoresist polymer of claim 1, wherein said cross-linker monomer is selected from the group consisting of compounds of the formula:

3. The photoresist polymer of claim 1, wherein said cross-linker monomer is selected from the group consisting of 2,5-hexanediol diacrylate; 2,5-hexanediol dimethacrylate; 2,4-pentanediol diacrylate; 2,4-pentanediol dimethacrylate; neopentyl glycol diacrylate; and neopentyl glycol dimethacrylate.

4. The photoresist copolymer according to claim 1 of the formula:

or

-continued wherein $R_1$, $R_2$, $R_3$, $R_4$, $R_5$, $R_6$, $R_7$, $R_8$, and k are those defined in claim 1;

each of $R_9$ and $R_{10}$ is independently H, substituted or unsubstituted linear or branched $(C_1-C_5)$alkyl;

i is 0 or 1;

m and n is independently an integer from 0 to 2; and the ratio of a:b:c:d:e=0–80 mol %: 1–30 mol %: 1–30 mol % 0.1–48 mol %: 10–50 mol %.

5. A process for preparing a photoresist polymer of claim 1, comprising the steps of:

(a) admixing
  (i) a cross-linker monomer of the formula:

wherein A, B, $R_1$, $R_2$, $R_3$, $R_4$, $R_5$, $R_6$, $R_7$, $R_8$, and k are those defined in claim 1;

(ii)

where i is 0 or 1e;
  (iii) at least one other suitable photoresist monomer, and
  (iv) a polymerization initiator; and (b) providing polymerization conditions sufficient to produce said photoresist polymer from said admixture of step (a).

6. The process according to claim 5, wherein said polymerization conditions comprises heating said admixture to temperature in the range of from about 60 to about 70° C. for 4 to 24 hours under an inert atmosphere.

7. The process according to claim 5, wherein said admixture further comprises an organic solvent selected from the group consisting of cyclohexanone, tetrahydrofuran, dimethylformamide, dimethylsulfoxide, dioxane, methylethylketone, benzene, toluene, xylene and mixtures thereof.

8. The process according to claim 5, wherein said polymerization initiator is selected from the group consisting of 2,2'-azobisisobutyronitrile (AIBN), acetylperoxide, laurylperoxide, tert-butyl peracetate, tert-butyl hydroperoxide and di-tert-butylperoxide.

9. The process according to claim 5, wherein said process further comprises the step of purifying said polymer by crystallization using a crystallization solvent selected from the group consisting of diethylether; petroleum ether; alcohol; water; and mixtures thereof.

10. A photoresist composition comprising: (i) a photoresist polymer of claim 1, (ii) an organic solvent and (iii) a photoacid generator.

11. The composition according to claim 10, wherein said photoacid generator is a sulfide or onium type compound.

12. The composition according to claim 10, wherein said photoacid generator comprises diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, or mixtures thereof.

13. The composition according to claim 10, wherein the amount of said photoacid generator is in the range of from about 0.05 to about 10% by weight of said photoresist polymer.

14. The composition according to claim 10, wherein said organic solvent is selected from the group consisting of methyl 3-methoxypropionate, ethyl 3-ethoxypropionate, propylene glycol methyl ether acetate, cyclohexanone, cyclopentanone, 2-heptanone and (2-methoxy)ethyl acetate.

15. The composition according to claim 10, wherein the amount of said organic solvent is in the range of from about 200 to about 1000% by weight of said photoresist polymer.

16. A process for forming a photoresist pattern, comprising the steps of: (a) coating said photoresist composition of claim 10 on a substrate of semiconductor device to form a photoresist film; (b) exposing said photoresist film to light using a light source; and (c) developing said exposed photoresist film.

17. The process according to claim 16, further comprising: a baking step before and/or after exposure of step (b).

18. The process according to claim 17, wherein the baking step is performed at 70 to 200° C.

19. The process according to claim 16, wherein said light source is ArF, KrF, VUV, EUV, E-beam, X-ray or ion beam.

20. The process according to claim 16, wherein said photoresist film is irradiated with from about 1 $mJ/cm^2$ to about 100 $mJ/cm^2$ of light-exposure energy.

21. A semiconductor device manufactured by the process of claim 16.

* * * * *

UNITED STATES PATENT AND TRADEMARK OFFICE
CERTIFICATE OF CORRECTION

PATENT NO. : 6,403,281 B1 Page 1 of 1
DATED : June 11, 2002
INVENTOR(S) : Geun Su Lee, Jae Chang Jung and Ki Ho Baik It is certified that error appears in the above-identified patent and that said Letters Patent is hereby corrected as shown below:

Column 2,
Lines 16-18, the paragraph " Still another objective of the present is to provide a photoresist composition comprising such photoresist polymer." should read -- Still another objective of the present invention is to provide a photoresist composition comprising such photoresist polymer. --.

Column 14,
Line 35, the phrase "(iii) at least one other suitable photoresist monomer."
should read -- (iii) optionally at least one other suitable photoresist monomer. --

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,403,281 B1
DATED          : June 11, 2002
INVENTOR(S)    : Geun Su Lee, Jae Chang Jung and Ki Ho Baik

It is certified that error appears in the above-identified patent and that said Letters Patent is hereby corrected as shown below:

Column 9,
Lines 64-65, the phrase "dibutylnaphthylsalfonium triflate" should read
-- dibutylnaphthylsulfonium triflate --.

Column 14,
Lines 40-58, please replace the formula with the following formula:

Column 15,
Lines 1-45, please replace the formula with the following formula:

UNITED STATES PATENT AND TRADEMARK OFFICE
CERTIFICATE OF CORRECTION

PATENT NO. : 6,403,281 B1
DATED : June 11, 2002
INVENTOR(S) : Geun Su Lee, Jae Chang Jung and Ki Ho Baik It is certified that error appears in the above-identified patent and that said Letters Patent is hereby corrected as shown below:

<u>Column 15, lines 45-67 to Column 17, lines 1-29,</u>
please replace the formula with the following formula:

Signed and Sealed this

Seventh Day of December, 2004

JON W. DUDAS
*Director of the United States Patent and Trademark Office*